(12) United States Patent
Koch et al.

(10) Patent No.: US 7,707,706 B2
(45) Date of Patent: May 4, 2010

(54) METHOD AND ARRANGEMENT FOR PRODUCING A SMART CARD

(75) Inventors: Matthias Koch, Lauchroeden (DE); Bernd Gebhardt, Moorgrund (DE)

(73) Assignee: ruhlamat GmbH, Marksuhl (DE)

( * ) Notice: Subject to any disclaimer, the term of this patent is extended or adjusted under 35 U.S.C. 154(b) by 0 days.

(21) Appl. No.: 11/772,096

(22) Filed: Jun. 29, 2007

(65) Prior Publication Data
US 2009/0000107 A1 Jan. 1, 2009

(51) Int. Cl.
*H01Q 13/00* (2006.01)
*H01Q 1/28* (2006.01)

(52) U.S. Cl. ............... 29/600; 29/601; 29/606; 29/592.1; 29/832; 343/700 MS; 343/786

(58) Field of Classification Search ............. 29/600, 29/601, 830, 831, 841, 865, 866, 827; 235/487, 235/380, 375, 492, 737; 361/736, 737, 771, 361/748, 760; 343/866, 873; 174/258–264
See application file for complete search history.

(56) References Cited

U.S. PATENT DOCUMENTS

| 5,399,847 | A | * | 3/1995 | Droz | ............... | 235/488 |
| 5,996,897 | A | * | 12/1999 | Prancz | ............... | 235/492 |
| 6,208,019 | B1 | * | 3/2001 | Tane et al. | ............... | 257/679 |
| 6,233,818 | B1 | | 5/2001 | Finn et al. | | |
| 6,288,905 | B1 | * | 9/2001 | Chung | ............... | 361/771 |
| 6,293,470 | B1 | * | 9/2001 | Asplund | ............... | 235/487 |
| 6,320,753 | B1 | * | 11/2001 | Launay | ............... | 361/760 |
| 6,321,993 | B1 | * | 11/2001 | Riener et al. | ............... | 235/492 |
| 6,698,089 | B2 | | 3/2004 | Finn et al. | | |
| 6,719,205 | B1 | * | 4/2004 | Puschner et al. | ............... | 235/492 |
| 6,810,580 | B2 | * | 11/2004 | Yamaguchi et al. | ............... | 29/748 |
| 6,881,605 | B2 | * | 4/2005 | Lee et al. | ............... | 438/106 |
| 6,886,246 | B2 | * | 5/2005 | Chung | ............... | 29/832 |

FOREIGN PATENT DOCUMENTS

| DE | 196 16 424 A1 | 10/1997 |
| DE | 10 2004 045 896 A1 | 3/2006 |
| EP | 0 880 754 | 12/1998 |
| WO | WO 98/40766 | 9/1998 |
| WO | WO 2008/037579 A1 | 4/2008 |
| WO | WO 2008/114091 A2 | 9/2008 |

* cited by examiner

*Primary Examiner*—Minh Trinh
(74) *Attorney, Agent, or Firm*—Muncy, Geissler, Olds & Lowe, PLLC

(57) ABSTRACT

A method is provided for producing a smart card comprising a chip module with at least one contacting area, the chip module arrangeable in a mounting location of a substrate, wherein one contacting loop is formed from a wire connector fed by a wire guiding unit for at least one of the contacting areas, respectively by attaching a first section of the wire conductor to a surface of the substrate outside the mounting location, wherein a second section of the wire conductor proximate to the first section is guided to form the contacting loop along with and protruding from the surface, wherein a subsequent third section of the wire conductor is attached to the surface outside the mounting location, wherein the chip module is inserted into the mounting location and wherein the second section is bent over and electrically contacted to the contacting area.

21 Claims, 3 Drawing Sheets

METHOD AND ARRANGEMENT FOR PRODUCING A SMART CARD

BACKGROUND OF THE INVENTION

1. Field of the Invention

The invention refers to a method and an arrangement for producing a smart card.

2. Description of the Background Art

Documents, such as passports, identity documents and ID-cards, particularly in the formats ID-1, ID-2 and ID-3 are often equipped with RFID (Radio Frequency Identification Device) systems according to the ICAO 9303 specification. Normally an RFID transponder with an antenna coil is applied for this purpose. The antenna coil can be produced by etching a copper or aluminium film, by silkscreen printing or by inkjet printing with electrically conductive pastes. Alternatively, thin enamel-insulated copper wires with 30 µm to 150 µm thickness are run on an inner layer, a chip module is inserted on the inner layer or a recess thereof and the wire ends are contacted to the chip module.

The European Patent EP 0 880 754 B1, which corresponds to U.S. Pat. No. 6,233,818, discloses a process for the contacting of a wire conductor in the course of the manufacture of a transponder unit arranged on a coil substrate and including a wire coil, wherein in a first phase the wire conductor is guided over and away from a terminal area or a region accepting the terminal area and the wire conductor is fixed on the substrate relative to the terminal area or the region assigned to the terminal area; and wherein in a second phase a connection of the wire conductor to the terminal area is effected with a connecting instrument and the wire conductor is connected while being fixed on the coil substrate and extending in parallel to the surface plane of the windings of the wire coil. The problem with this and other known techniques is, that electrical connections in smart cards are subject to mechanical stress due to bending and distorting and thus prone to failure. This is a rather minor problem in credit cards that are usually replaced after two years. In passports and ID cards, which are supposed to endure about ten years or more, this is a major drawback.

SUMMARY OF THE INVENTION

It is therefore an object of the invention to provide a method for producing a smart card with high endurance electrical contacts and an arrangement for producing such a smart card.

The method according to the invention is used for producing a smart card comprising a chip module with at least one contacting area, the chip module being arrangeable in a mounting location of a substrate. In the method a contacting loop is formed from a wire connector fed by a wire guiding unit for at least one of the contacting areas, respectively. The contacting loop can be formed by attaching a first section of the wire conductor to a surface of the substrate outside the mounting location. A second section of the wire conductor proximate to the first section can be guided to form the contacting loop along with and protruding from the surface, for example, roughly perpendicularly. A subsequent third section of the wire conductor can be attached to the surface outside the mounting location, so that the contacting loop is closed. The chip module is inserted into the mounting location, the second section is bent over and electrically contacted to the contacting area. Due to the shape of the contacting loop the wire connector can be curved instead of straight near the contacting area thus providing a strain relief so bending and distorting the smart card or subjecting it to temperature changes will impose less mechanical stress on the contacts than with a straight wire connector. Another advantage is that the chip module does not necessarily have to be inserted prior to the wiring. In conventional art methods for contacting RFID chips in smart cards the chip module has to be inserted before the wire connector is attached and contacted to form an antenna coil, because it is run straight across the contacting areas.

In the method according to the invention the chip module may be inserted after the contacting loops are established before bending them over because the mounting location is still clear at that time due to the fact that the first and third section of the wire connector are attached outside the mounting location. The major advantage here is that the wire connectors, in particular when used as an antenna coil, may be tested optically and electrically before inserting the chip module. In case the wire connectors fail in a testing process, the substrate with the wire connectors may be discarded without a chip module.

By contrast, the wire connectors or antenna coils of a smart card produced according to a conventional method can only be tested when the chip module is already inserted and contacted. In case of failure the whole smart card including the chip module must be discarded, which causes higher costs than with the method according to the invention. Chip modules for application in passports according to ICAO 9303 contain particularly large integrated circuits with an EEPROM capacity of at least 64 kBit and are much more expensive than the substrates and antenna coils. However the chip module may be inserted before the wiring as well, according to an embodiment of the invention.

The term chip module may also refer to a so called interposer, which is a chip arranged on a thin film with two contacting areas, wherein the chip may be arranged by flip-chip contacting, wire bonding technique, or another contacting technique. The chip module may be an RFID module. In particular, in this case, the chip module can exhibit two contacting areas for contacting a wire connector in the shape of an antenna coil. The smart card may be used as a passport, ID card or another identity document. Additional steps may be required in order to complete the smart card.

In an embodiment, the antenna coil may be arranged around the mounting location. In this case the wire connector exhibits an intersection. In another embodiment the antenna coil is arranged so that a part of it traverses the mounting location. The chip module is inserted on top of this part in this case. The advantage of this embodiment is that an intersection of the wire connector may be avoided, thus saving headroom. Furthermore the wire connector does not necessarily have to be insulated in this embodiment. However, slightly more headroom is demanded in the area of the chip module because of the wire connector running below.

In an embodiment, the protruding shape of the second section is achieved by appropriately lifting and sinking the wire guiding unit and by varying a feed rate of the wire connector. The wire guiding unit should be displaceable normally to the surface for this purpose.

In another embodiment of the invention the shape of the second section is achieved by guiding it around an auxiliary tool to determine the shape of the contacting loop by means of the wire guiding unit. The auxiliary tool, e.g. which can be in the shape of a pin, should be placeable in a position between the surface and the second section and removeable from this position. Thus the contacting loop may be given, for example, an Omega-shape, thereby resulting in a particularly good stress relief.

The wire guiding unit may be integrated in an ultrasonic sonotrode. The ultrasonic sonotrode may provide energy for attaching the first section and the third section to the surface. Other parts of the wire connector may be attached by the ultrasonic sonotrode as well. When laying an antenna coil, it is usually at least partly embedded in the surface by softening the substrate by means of ultrasonic energy. For this purpose a thermoplastic film may be used as the substrate.

The second section can be guided in a manner resulting in a contacting loop protruding at most 2 mm from the surface. However the protrusion may be limited to a few tenths of a millimeter, as well.

The term mounting location may simply denote the location in the substrate, where the chip module should be installed without a structural difference to the rest of the substrate. The chip module may be fixed to the substrate before or after the wiring in this case. This embodiment may be applied with chip modules that are not thicker than 150 µm, particularly less than 100 µm, and most preferably less than 80 µm. In another embodiment the mounting location may be formed as a recess in the substrate, in the shape of an indentation or an aperture.

The wire connector may be an enamel-insulated copper wire. Depending on the technique used for electrically contacting the contacting loop to the contacting area, the enamel may have to be removed from the respective part of the wire connector prior to the contacting. Other techniques may not require removal of the enamel. The contacting technique may be one technique of the group thermal bonding, ultrasonic welding, soldering, laser soldering, laser welding, gluing, crimping. Bending and contacting may also be carried out by the ultrasonic sonotrode.

In another embodiment, at least one additional film may be attached to at least one of the two surfaces of the substrate, particularly another thermoplastic film. In particular, if the mounting location is designed as an aperture, an additional film may be attached below the substrate in order to support the chip module. Another additional film may be placed on top of the chip module after the wiring and contacting, also in such a case when the mounting location is not a recess. The additional film to be placed on top of the chip module may exhibit a recess for encasing the chip module. It may as well exhibit a softening temperature which is lower than a softening temperature of the substrate. The substrate and the additional film may be aligned and fixed together in at least two areas by, for example, heat, pressure, or energy provided by the ultrasonic sonotrode in order to ease the handling of the smart card without affecting the contacts.

The substrate may be processed alone or as one of a multitude of segments of a multi-image board. The segments may be processed sequentially by one arrangement according to the invention. In another embodiment, at least two of the segments may be processed simultaneously or substantially simultaneously by a respective arrangement.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
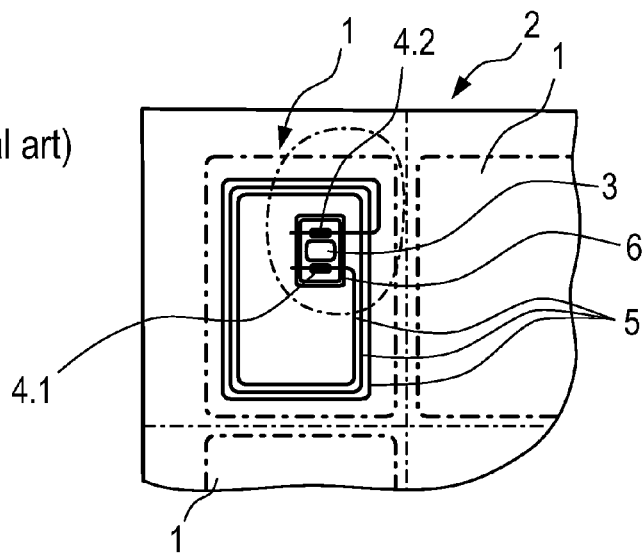
FIG. 1 is a top view illustrating a conventional smart card that is one of a multitude of segments of a multi-image-board.

FIG. 1 is a top view of a substrate 1 of a smart card, which can be one of a multitude of segments of a multi-image-board 2. The smart card 1 comprises a chip module 3 with two contacting areas 4.1, 4.2 and a wire connector 5 in the shape of an antenna coil arranged around the chip module 3. The wire connector 5 is laid, attached and contacted. The chip module 3 is attached on the substrate 1 in a mounting location 6, which may be designed as a recess in the substrate 1. For producing the smart card, the substrate 1, which can also be in single-image-format, is placed on a bench. The chip module 3 is arranged in the mounting location 6 with the contacting areas 4.1, 4.2 up. If the mounting location 6 is a recess in the form of an aperture, the chip module 3 may be fixed by a vacuum from below or by attaching it to an additional film (not shown) that is arranged below the substrate 1.

The wire connector 5 is attached to a surface of the substrate 1 or at least partially embedded therein by means of an ultrasonic sonotrode (not shown). The substrate 1 is usually a thermoplastic film. The wire connector 5 may be an enamel-insulated copper wire. The ultrasonic sonotrode comprises a wire guiding unit for feeding and guiding the wire connector 5.

Figure 2:
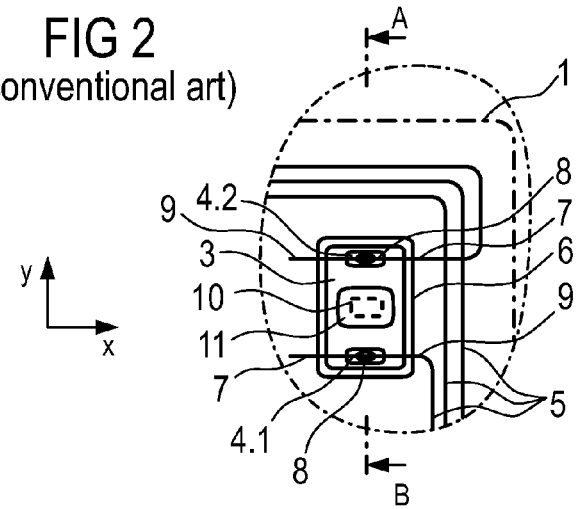
FIG. 2 is a detailed view of a cutout of the smart card from FIG. 1, that is produced by the conventional method.

FIG. 2 is a more detailed view of a cutout of the smart card from FIG. 1 with the chip module 3, the contacting areas 4.1, 4.2, the chip module 3 being composed of an integrated circuit 10 encased in a chip embedding compound 11.

For laying the wire connector 5 on the substrate 1 and contacting it to the contacting area 4.1, a first section 7 of the wire connector 5 is attached to the surface outside the mounting location 6, i.e. displaced in an x-direction. A second section 8, adjacent to the first section 7, is run across the contacting area 4.1 and a subsequent third section 9 is again attached to the surface behind the contacting area 4.1. The wire connector 5 can then be embedded into the substrate 1 in order to form the antenna coil. The end of the wire connector 5 is run intersecting the established windings of the antenna coil in order to connect it in a similar way to the other contacting area 4.2. Eventually the wire connector 5 is cut or grooved and ripped off behind the contacting area 4.2. The second sections 8 are electrically contacted to the respective contacting areas 4.1, 4.2. The process is usually followed by lamination steps.

Figure 3:
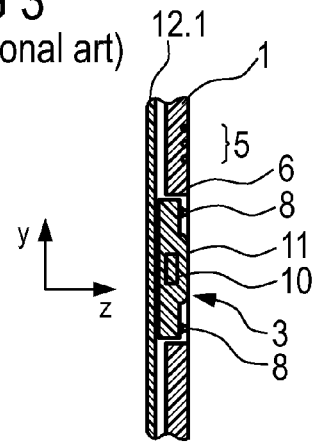
FIG. 3 is a sectional view of the smart card from FIG. 2 in a section plane A-B.

FIG. 3 is a sectional view of the smart card from FIG. 2 in the section plane A-B. The mounting location 6 is a recess in the substrate 1 in the shape of an aperture. The chip module 3 is supported by an additional film 12.1 attached to its back side and at least loosely affixed to the substrate 1. FIG. 2 and 3 both show a smart card produced by a conventional method.

Figure 4:
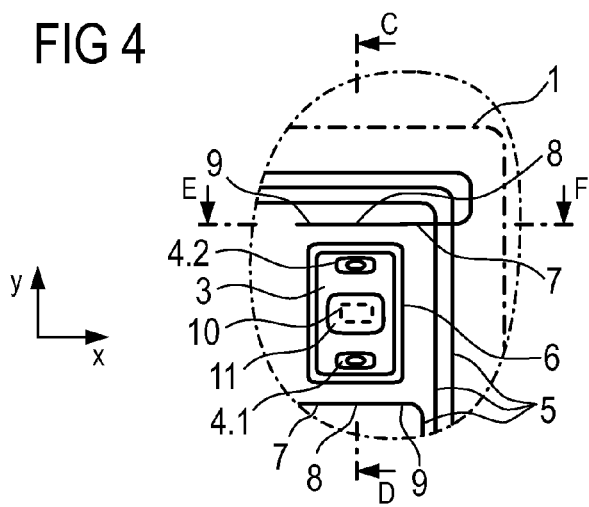
FIG. 4 is a detailed view of a smart card according to an embodiment of the present invention, whereby an antenna coil that is attached to the substrate is not yet contacted to the chip module.

FIG. 4 is a detailed view of a smart card according to an embodiment of the present invention. Shown is an intermediate step of an embodiment of the method according to the invention, which the smart card is produced with in this figure. By contrast to the conventional art method, for laying the wire connector 5 on the substrate 1 and contacting it to the contacting area 4.1, the first section 7 of the wire connector 5 is attached to the surface of the substrate 1 outside the mounting location 6, additionally displaced in a y-direction. The second section 8 adjacent to the first section 7 is guided to form a contacting loop along with and protruding from the surface 1 in a z-direction. This can be seen in FIG. 5, which is a sectional view of the smart card from FIG. 4 in the section plane C-D. The third section 9 is again attached to the surface outside the mounting location 6, additionally displaced in y-direction in order to close the contacting loop. Thus the mounting location 6 is kept clear, so the chip module 3 may be inserted after the contacting loops are established as well as before. The wire connector 5 can then be embedded into the substrate 1 in order to form the antenna coil. The end of the wire connector 5 is run intersecting the established windings of the antenna coil in order to form a similar contacting loop for the contacting area 4.2. Eventually the wire connector 5 is cut or grooved and ripped off behind the contacting area 4.2. After the insertion of the chip module 3 the second sections 8 are bent over and electrically contacted to the respective contacting areas 4.1, 4.2. The process is usually followed by lamination steps. In the example shown the mounting location 6 is a recess in the substrate 1 in the shape of an aperture. The chip module 3 is supported by an additional film 12.1 attached to its back side and at least loosely affixed to the substrate 1. The mounting location 6 may as well be in the shape of an indentation. The term mounting location 6 may also denote the location in the substrate 1, where the chip module 3 is supposed to be installed without a structural difference to the rest of the substrate 1. In these cases an additional film 12.1 does not necessarily have to be arranged. The embedding of the wire connector 5 in the range of the antenna coil may also be deeper or shallower than in the figure.

Figure 6:
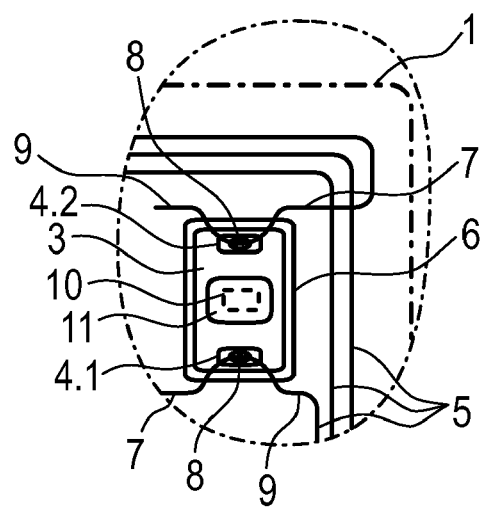
FIG. 6 is a view of the smart card from FIG. 4 with the contacting loops of the antenna coil bent over to the contacting areas of the chip module, whereby the contacting loops resemble a bell-shaped curve.

FIG. 6 is a view of the smart card from FIG. 4 in a subsequent step of the method according to the invention. The contacting loops or the second sections 8, respectively are bent over to the contacting areas 4.1, 4.2 of the chip module 3 and electrically contacted to them. The second sections 8 resemble a belkshaped curve, respectively. This shape can be achieved by appropriately lifting and sinking the wire guiding unit and by varying a feed rate of the wire connector 5 when establishing the contacting loop in the earlier step of the method shown in FIG. 4.

Figure 7:
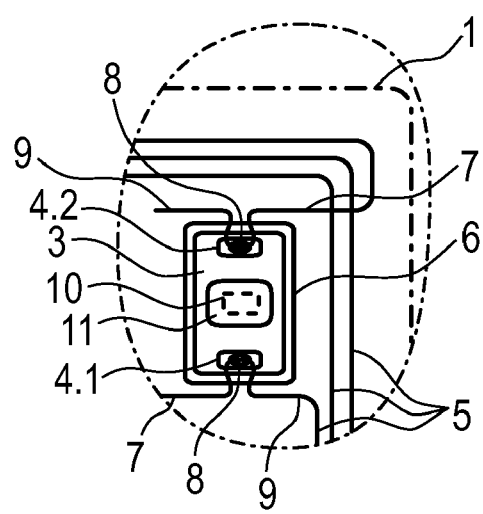
FIG. 7 is a view of the smart card from FIG. 4 with the contacting loops of the antenna coil bent over towards the contacting areas of the chip module, the contacting loops, in this embodiment, resembling an Omega shape.

FIG. 7 is another view of the smart card from FIG. 4 with the contacting loops of the respective second sections 8 bent over to the contacting areas 4.1, 4.2 of the chip module 3. In this case the second sections 8 resemble an Omega, thus yielding an even better stress relief. This shape is achieved by appropriately lifting and sinking the wire guiding unit, by varying a feed rate of the wire connector 5 and by guiding the wire connector 5 around a pin-shaped auxiliary tool, which will be shown in FIG. 9.

The forming of the contacting loops resembling the bell-shaped curves as shown in FIG. 6 may also be supported by an auxiliary tool.

Figure 5:
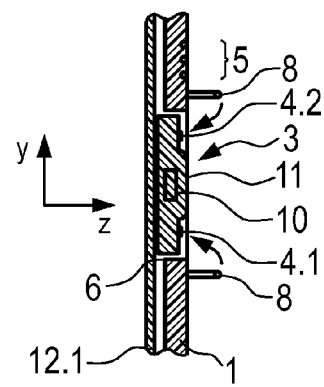
FIG. 5 is a sectional view of the smart card from FIG. 4 in a section plane C-D.
Figure 8:
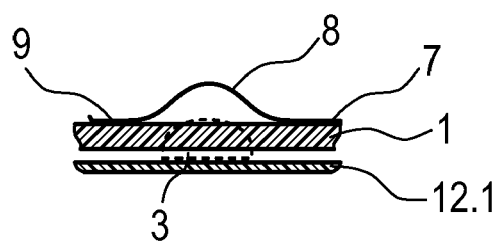
FIG. 8 is a sectional view of the smart card from FIG. 4 in the section plane E-F, whereby the contacting loop resembles a bell-shaped curve.

FIG. 8 is a sectional view of the smart card from the FIGS. 4, 5 and 6 in the section plane E-F shown in FIG. 4. The contacting loop or the second section 8, respectively resembles a bell-shaped curve.

Figure 9:
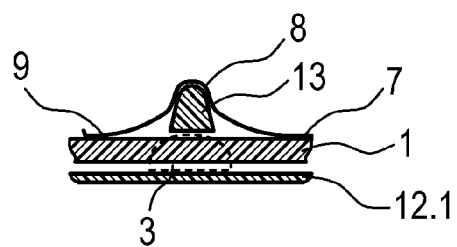
FIG. 9 is a sectional view of the smart card from FIG. 4 in the section plane E-F, the contacting loop resembling a bell-shaped curve, with an auxiliary tool for shaping the contacting loop.

FIG. 9 shows another sectional view of the smart card from the FIGS. 4 and 5 in the section plane E-F. The contacting loop or the second section 8, respectively is shaped by appropriately lifting and sinking the wire guiding unit, by varying a feed rate of the wire connector 5 and by guiding the wire connector 5 around the pin-shaped auxiliary tool 13, which can be placed in a position between the surface of the substrate 1 and the second section 2 as shown in the figure and which can be removed from this position when the contacting loop is shaped.

The shapes of the second sections 8 shown in the FIGS. 6, 7, 8 and 9 are selected from a multitude of possible shapes, which the second sections 8 may exhibit as a result of the method according to the invention. The shape of the second section 8 can be influenced by the shape of the auxiliary tool 13, by the feed rate, or by the way the wire guiding unit is guided.

Figure 10:
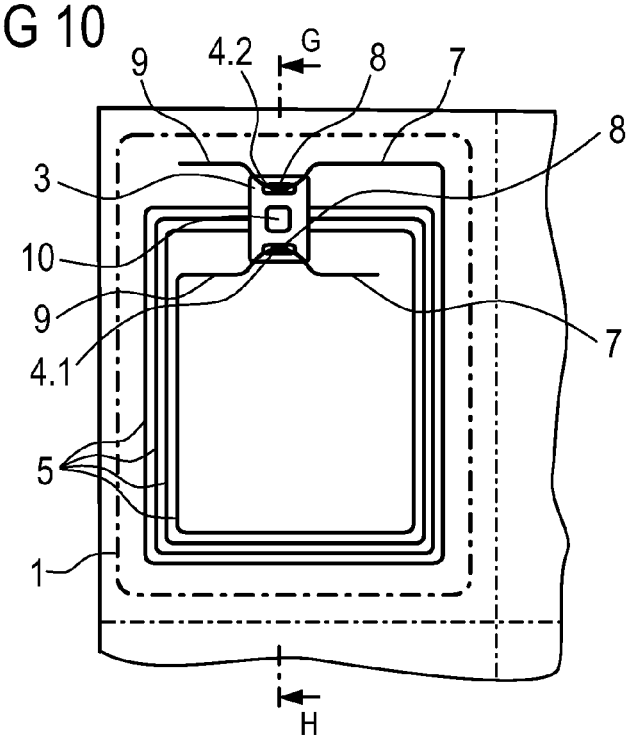
FIG. 10 is a top view of a smart card according to an embodiment of the present invention, whereby the smart card comprises a chip module and an antenna coil arranged, in part, below the chip module.

FIG. 10 is a top view of another embodiment of a smart card. In this example, the contacting loops may be established similarly to what has been shown in the preceding figures. By contrast for forming the antenna coil, the wire connector 5 is partially run below the chip module 3 across the mounting location 6 instead of around it, namely before the chip module 3 is inserted. This design can only be achieved by the method according to the invention because the conventional art methods require the chip module 3 to be inserted before the wiring. Arranging the chip module 3 as shown allows for avoiding intersections when running the wire connector 5.

Figure 11:
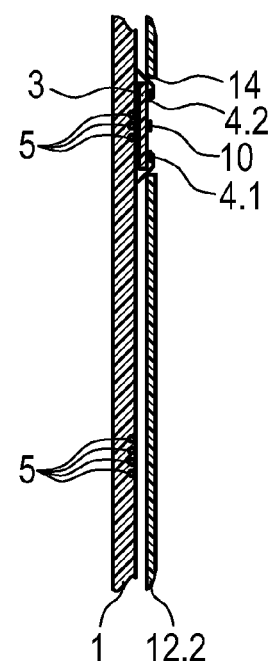
FIG. 11 is a sectional view of the smart card from FIG. 10 in a section plane G-H.

FIG. 11 is a sectional view of the smart card from FIG. 10 in the section plane G-H. The chip module 3 may be attached using an adhesive or by ultrasonic energy and pressure. An additional film 12.2 is arranged on the chip module side of the substrate 1. The additional film 12.2 exhibits a recess 14 for encasing the chip module 3.

The additional film 12.2 on the chip module side of the substrate 1 may be arranged in all of the embodiments shown. Instead of the recess 14 it may exhibit a softening temperature, which is lower than a softening temperature of the substrate 1 thus leading to a good embedding of the chip module 3 during a subsequent lamination step and avoiding the need for an accurate alignment of the additional film 12.2 and the substrate 1.

The method according to the invention may also be applied for a chip module 3 with more or less than two contacting areas 4.1, 4.2. Not all of the contacting areas 4.1, 4.2 have to be connected by an antenna coil.

The antenna coil or other wire connectors 5 may be tested prior to inserting the chip module. The smart card may be discarded if the antenna coil or other wire connectors 5 fail in the test.

The wire guiding unit may be integrated with an ultrasonic sonotrode.

The substrate 1 and the additional films 12.1, 12.2 may be thermoplastic films.

The contacting loop may be laid protruding perpendicularly or with any other angle from the surface.

The contacting loop may protrude at most 2 mm from the surface.

The wire connector 5 may be an enamelinsulated copper wire. In particular in the embodiment shown in FIGS. 10 and 11 the wire connector 5 does not necessarily have to be insulated.

The second section 8 may be electrically contacted to the respective contacting area 4.1, 4.2 by a technique, such as thermal bonding, ultrasonic welding, soldering, laser soldering, laser welding, gluing, crimping.

The substrate 1 may be a single-image-board or one of a multitude of segments of a multi-image-board 2. The segments may be processed sequentially by one arrangement according to the invention. In another embodiment of the invention at least two of the segments may be processed simultaneously by a respective arrangement. Multi-image-boards may be in the shape of sheets or rolls.

The chip module 3 may be an RFID module.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a smart card, the method comprising:
   providing a chip module with at least one contacting area, the chip module being arrangeable in a mounting location of a substrate;
   forming one contacting loop from a guided wire conductor for at least one of the contacting areas, respectively, by attaching a first section of the wire conductor to a surface of the substrate outside of the mounting location;
   guiding a second section of the wire conductor that is proximate to the first section to form the contacting loop along with and protruding from the surface of the substrate;
   attaching a subsequent third section of the wire conductor to the surface of the substrate outside of the mounting location;
   inserting the chip module into the mounting location;
   bending the second section over towards the contacting area;
   electrically contacting the second section to the contacting area;

2. The method according to claim 1, wherein the chip module has at least two contacting areas, and further comprising connecting at least two of the contacting areas to a respective contacting loop, wherein both contacting loops are part of the same wire connector that is formed as an antenna coil.

3. The method according to claim 2, further comprising arranging the antenna coil around the mounting location.

4. The method according to claim 2, further comprising arranging the antenna coil so that a portion of the antenna coil traverses the mounting location, and inserting the chip module on top of the portion of the antenna coil.

5. The method according to claim 1, further comprising inserting the chip module before the step of forming the contacting loop.

6. The method according to claim 1, further comprising inserting the chip module after the step of forming the contacting loop.

7. The method according to claim 1, further comprising guiding the second section by lifting and sinking a wire guiding unit and varying a feed rate of the wire connector.

8. The method according to claim 1, further comprising feeding the wire connector by a wire guiding unit integrated in an ultrasonic sonotrode and attaching the first section and the third section to the surface of the substrate by energy provided by the ultrasonic sonotrode, and wherein the substrate is a thermoplastic film.

9. The method according to claim 8, further comprising attaching at least one additional film is attached to at least one of two surfaces of the substrate.

10. The method according to claim 9, wherein the additional film has a recess for encasing the chip module.

11. The method according to claim 9, wherein the additional film has a softening temperature that is lower than a softening temperature of the substrate.

12. The method according to claim 1, further comprising guiding the second section such that a contacting loop is formed that protrudes substantially perpendicularly from the surface.

13. The method according to claim 1, further comprising guiding the second section such that a contacting loop is formed that protrudes substantially 2 mm from the surface at most.

14. The method according to claim 1, further comprising forming the mounting location as a recess in the substrate.

15. The method according to claim 1, further comprising using an enamel-insulated copper wire as the wire connector.

16. The method according to claim 1, further comprising electrically contacting the second section to the contacting area by thermal bonding, ultrasonic welding, soldering, laser soldering, laser welding, gluing, or crimping.

17. The method according to claim 1, wherein the substrate is one of a multitude of segments of a multi-image board, and wherein the segments are processed sequentially.

18. The method according to claim 1, characterized in that the substrate is one of a multitude of segments of a multi-image board, and wherein at least two of the segments are processed substantially simultaneously by respective wire guiding units.

19. The method according to claim 1, further comprising guiding the second section around an auxiliary tool to form the shape of the contacting loop.

20. The method according to claim 19, further comprising forming the contacting loop in an Omega-shape.

21. The method according to claim 2, further comprising testing the antenna coil and inserting the chip module if the antenna coil passes the test.

* * * * *